(12) United States Patent
Chen et al.

(10) Patent No.: US 8,846,448 B2
(45) Date of Patent: Sep. 30, 2014

(54) WARPAGE CONTROL IN A PACKAGE-ON-PACKAGE STRUCTURE

(75) Inventors: Meng-Tse Chen, Changzhi Township (TW); Wei-Hung Lin, Xinfeng Township (TW); Kuei-Wei Huang, Hsinchu (TW); Tsai-Tsung Tsai, Taoyuan (TW); Ai-Tee Ang, Hsinchu (TW); Ming-Da Cheng, Jhubei (TW); Chung-Shi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/571,665

(22) Filed: Aug. 10, 2012

(65) Prior Publication Data

US 2014/0045300 A1    Feb. 13, 2014

(51) Int. Cl.
*H01L 21/00* (2006.01)
*H01L 21/67* (2006.01)

(52) U.S. Cl.
CPC ................................ *H01L 21/67288* (2013.01)
USPC ............... 438/108; 438/14; 438/17; 438/614; 438/5; 438/12; 257/48; 257/415; 257/E21.531; 257/E21.522; 257/E21.524; 219/759; 219/201; 219/600; 324/754; 324/718; 324/765

(58) Field of Classification Search
CPC ................ H01L 21/67288; H01L 21/67242; H01L 22/34; H01L 22/30; H01L 22/32; H01L 22/00; H01L 22/12; H01L 23/48; H01L 23/585
USPC ............ 438/14, 17, 614, 5, 6, 10, 11, 12, 18, 438/108; 257/48, 415, 414, E23.01, 257/E21.531, E21.53, E21.499, E21.522, 257/E21.524; 219/759, 201, 121.85, 600; 324/539, 754, 719, 718, 765
See application file for complete search history.

(56) References Cited

U.S. PATENT DOCUMENTS

| | | | | |
|---|---|---|---|---|
| 6,835,598 | B2 * | 12/2004 | Baek et al. ..................... | 438/109 |
| 8,063,656 | B1 * | 11/2011 | Ubaldo et al. ........... | 324/763.01 |
| 2004/0016752 | A1 * | 1/2004 | Ratificar et al. ............... | 219/679 |
| 2010/0143656 | A1 * | 6/2010 | Zu ................................. | 428/172 |
| 2012/0086107 | A1 * | 4/2012 | Yamamoto et al. ........... | 257/632 |

OTHER PUBLICATIONS

Hubbard, et al. "Flip-Chip Process Improvements for Low Warpage." Electronic Components and Technology Conference (ECTC), 2010 Proceedings 60th. Jun. 1-4, 2010.

* cited by examiner

*Primary Examiner* — Julio J Maldonado
*Assistant Examiner* — Moazzam Hossain
(74) *Attorney, Agent, or Firm* — Eschweiler & Associates, LLC

(57) ABSTRACT

The present disclosure relates to a tool arrangement and method to reduce warpage within a package-on-package semiconductor structure, while minimizing void formation within an electrically-insulating adhesive which couples the packages. A pressure generator and a variable frequency microwave source are coupled to a process chamber which encapsulates a package-on-package semiconductor structure. The package-on-package semiconductor structure is simultaneously heated by the variable frequency microwave source at variable frequency, variable temperature, and variable duration and exposed to an elevated pressure by the pressure generator. This combination for microwave heating and elevated pressure limits the amount of warpage introduced while preventing void formation within an electrically-insulating adhesive which couples the substrates of the package-on-package semiconductor structure.

13 Claims, 4 Drawing Sheets

US 8,846,448 B2

WARPAGE CONTROL IN A PACKAGE-ON-PACKAGE STRUCTURE

BACKGROUND

Fabrication of 3D integrated chips requires stacking of multiple semiconductor packages, coupling of circuitry between respective packages, and bonding the packages with an electrically-insulating adhesive to form a package-on-package structure. Subsequent high-temperature processing steps such as curing the electrically-insulating adhesive subjects the package-on-package structure to mechanical stress which can result in unintended side-effects such as warpage, cracking, delamination, and defect formation.

DETAILED DESCRIPTION

Figure 1A:
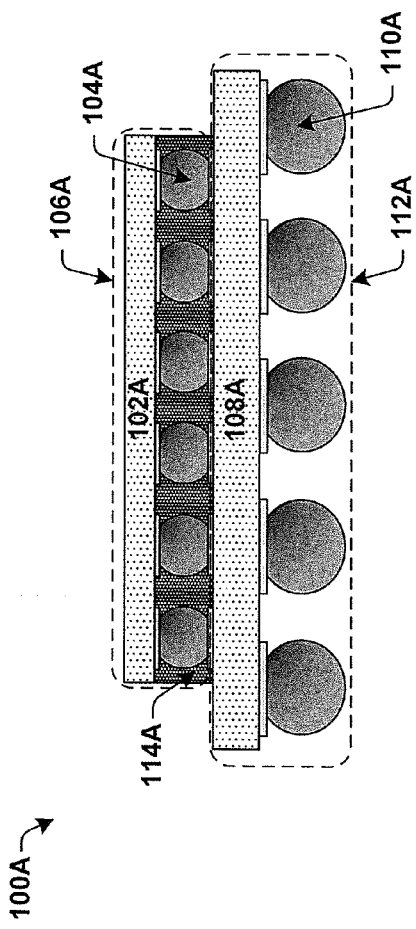
FIG. 1A illustrates some embodiments of a cross-sectional view of a package-on-package semiconductor structure.

The description herein is made with reference to the drawings, wherein like reference numerals are generally utilized to refer to like elements throughout, and wherein various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates some embodiments of a cross-sectional view of a package-on-package (PoP) semiconductor structure 100A, comprising a first substrate 102A coupled to a plurality of first solder balls 104A arranged in a first package 106A, and a second substrate 108A coupled to a plurality of second solder balls 110A arranged in a second package 112A. The plurality of first solder balls 104A and plurality of second solder balls 110A comprise flip-chip ball grid arrays (FCB-GAs) for 2.5D and 3D integrated chip applications. The first package 106A and second package 112A are coupled through the plurality of first solder balls 104A and bonded with an electrically-insulating adhesive 114A which forms an underfill layer between the first package 106A and second package 112A. The electrically-insulating adhesive 114A may comprise one or more of polyimide, polyetherimide, benzocyclobutene (BCB), bismaleimide-triazine (BT), epoxy, or silicone.

Figure 1C:
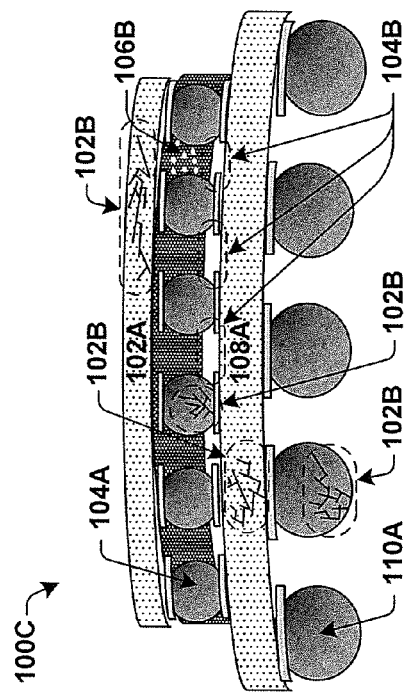
FIG. 1C illustrates some embodiments of a cross-sectional view of the types of damage formed on a package-on-package semiconductor structure caused by thermo-mechanical stress.
Figure 1B:
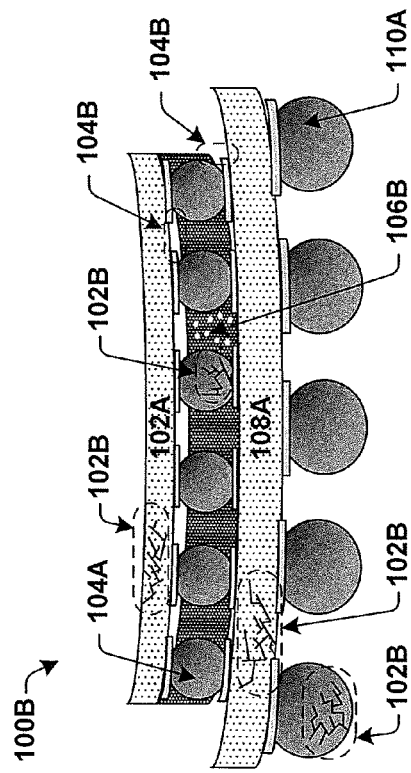
FIG. 1B illustrates some embodiments of a cross-sectional view of the types of damage formed on a package-on-package semiconductor structure caused by thermo-mechanical stress.

FIG. 1B illustrates some embodiments of a cross-sectional view of the types of damage formed on a package-on-package (PoP) semiconductor structure 100B caused by thermo-mechanical stress induced during high-temperature curing, comprising a concave warpage profile. The thermo-mechanical stress results in stress-induced cracks 102B within the PoP semiconductor structure 100B. Differences in thermal expansion properties associated with the first substrate 102A, second substrate 108A, and electrically-insulating adhesive 114A result in delamination 104B of one or more in interfaces formed between the first substrate 102A, second substrate 108A, and electrically-insulating adhesive 114A. The high-temperature curing may also cause void formation 106B within the electrically-insulating adhesive 114A which can degrade electrical properties (e.g., conductivity) of the first solder balls 104A. For completeness, FIG. 1C illustrates some embodiments of a cross-sectional view of the types of damage formed on a PoP semiconductor structure 100C comprising a convex warpage profile. It should be noted that the types of damage formed on the PoP semiconductor structure 100C comprise the same types of damage formed on the PoP semiconductor structure 100B.

To mitigate the effects of thermo-mechanical stress, a variable frequency microwave (VFM) source may be used for heating. VFM source heating distributes energy evenly across a PoP structure and only heats materials with polarizable electrons, as is the case for both a respective substrate and electrically-insulating adhesive. VFM source heating results in less warpage than convection heating methods, but does not mitigate the formation of defects such as voids an electrically-insulating adhesive. High-pressure curing may be used as to mitigate such effects as void formation, but does not reduce warpage.

Accordingly, the present disclosure relates to a tool arrangement and method to reduce warpage within a package-on-package semiconductor structure, while minimizing void formation within an electrically-insulating adhesive which couples the packages. A pressure generator and a variable frequency microwave source are coupled to a process chamber which encapsulates a package-on-package semiconductor structure. The package-on-package semiconductor structure is simultaneously heated by the variable frequency microwave source at variable frequency, variable temperature, and variable duration and exposed to an elevated pressure by the pressure generator. This combination for microwave heating and elevated pressure limits the amount of warpage introduced while preventing void formation within an electrically-insulating adhesive which couple the substrates of the package-on-package semiconductor structure.

Figure 2:
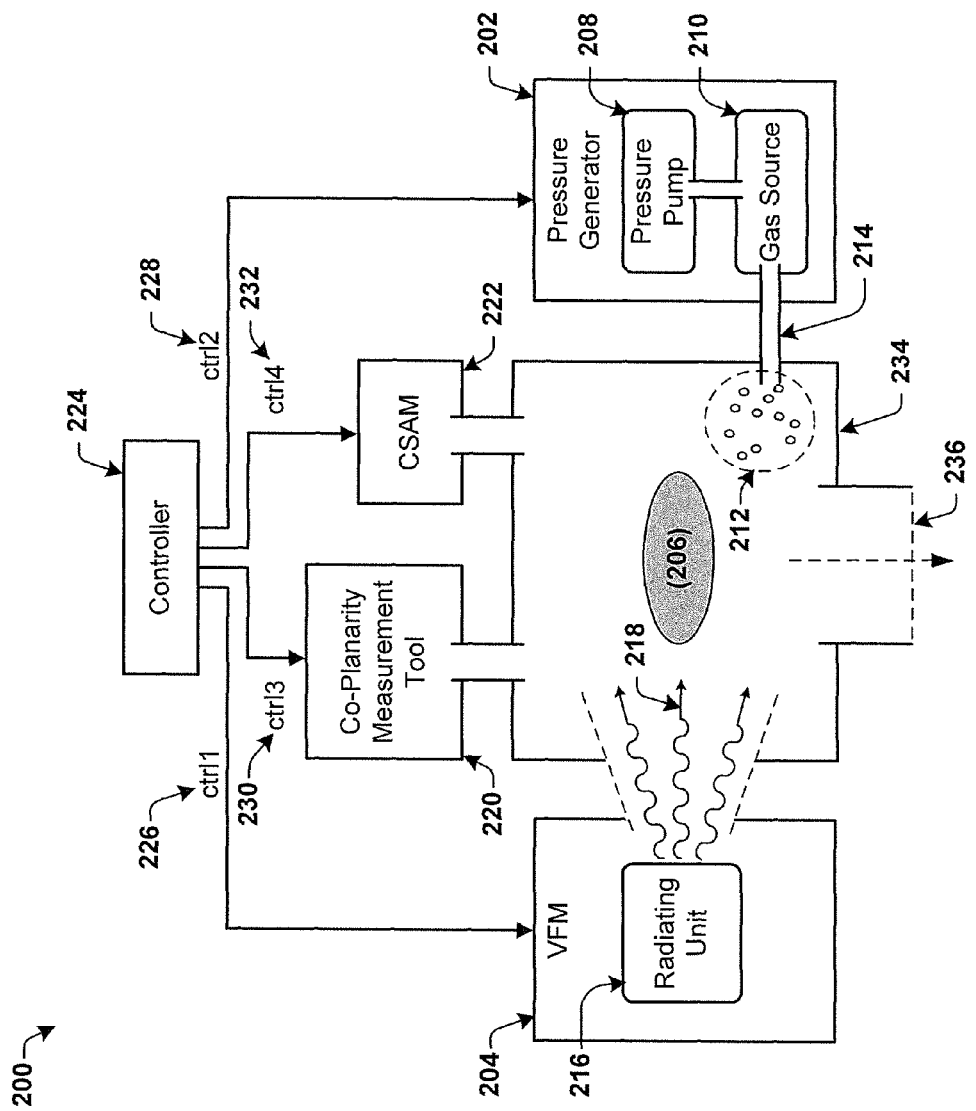
FIG. 2 illustrates some embodiments of a tool arrangement for package-on-package thermal processing, comprising a pressure generator and a variable frequency microwave source.

FIG. 2 illustrates some embodiments of a tool arrangement 200 for package-on-package (PoP) thermal processing, comprising a pressure generator 202 and a variable frequency microwave (VFM) source 204 which can operate simultaneously to cure a PoP structure 206. The pressure generator 202 comprises a pressure pump 208 coupled to a gas source 210 configured to generate an inert gas 212 (e.g., nitrogen) at a pressure greater than approximately 1 atmosphere (e.g., an elevated pressure), and a delivery apparatus 214 to deliver the inert gas 212 to the PoP structure 206. The VFM source 204 comprises a radiating unit 216 configured to irradiate the PoP structure 206 with microwave radiation 218 at variable frequency, variable temperature, and variable duration. To monitor warpage of the PoP structure 206, a co-planarity measurement tool 220 is used, which employs a Shadow Moire' technique to measure co-planarity of the edges of the PoP structure 206. De-void monitoring is also monitored with a Scanning Acoustical Microscope (CSAM) 222.

A controller 224 is configured to independently control operation of the pressure generator 202, the VFM source 204, the co-planarity measurement tool 220, and the CSAM 222, though the use of a first control signal 226, a second control signal 228, a third control signal 230, and a fourth control signal 232, respectively. The PoP structure 206 resides in a process chamber 234 configured to isolate the PoP structure 206 from an ambient environment such that an elevated pressure may be maintained throughout the variable microwave heating, and may be moved in and out of the process chamber 234 through a load-lock 236.

For the embodiments of the tool arrangement 200, the radiating unit 216 of the VFM source 204 emits microwaves comprising approximately five thousand frequencies cycled in a frequency range between approximately 5.8 and 7.0 GHz every 0.1 seconds for a residence time of 25 µs at each frequency, and with a temperature range between approximately 85° C. and approximately 145° C. to limit the PoP structure warpage. The VFM source 204 is configured to operate in multiple temperature domains over multiple time periods within these respective ranges. The pressure generator 202 is configured to generate an inert gas at a pressure range between approximately 1 atmosphere and approximately 10 atmospheres for a total time period of between approximately 10 minutes and approximately 120 minutes.

Figure 3:
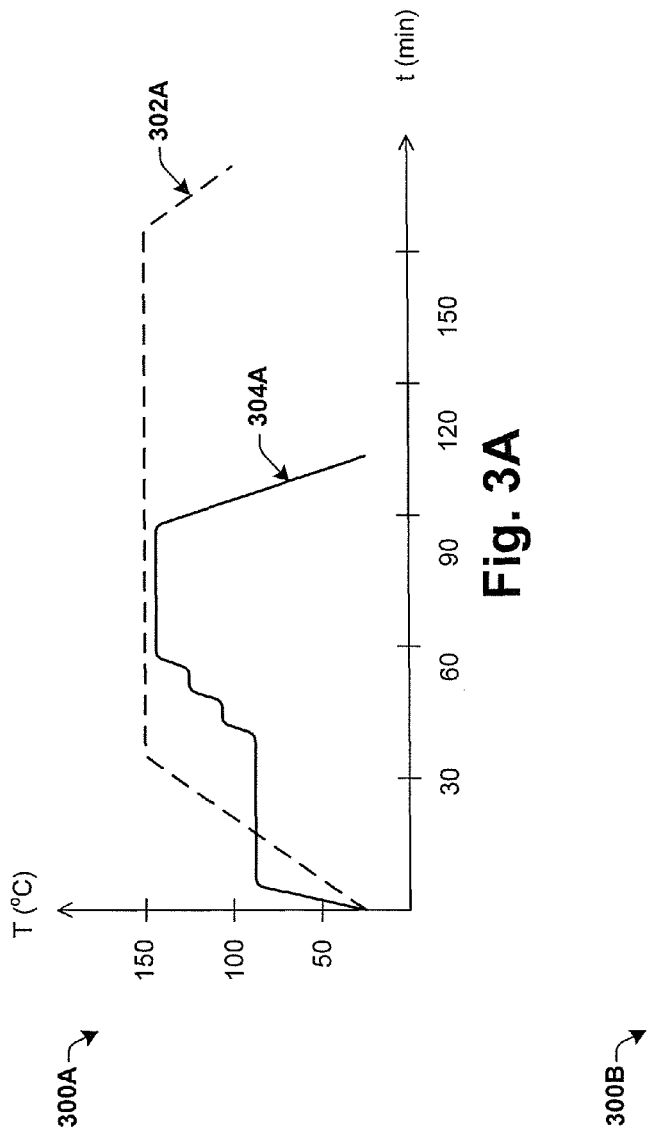
FIG. 3A illustrates some embodiments of a graph comparing a high-temperature cure by a convection heating method and variable frequency microwave source curing under elevated pressure.
FIG. 3B illustrates a table comprising some embodiments of results corresponding to an experiment carried out according to FIG. 3A.

To compare the effectiveness of VFM source curing under an elevated pressure with a convection heating method, the amount of warpage and the amount of voids generated for a PoP structure resulting from each method may be measured. FIG. 3A illustrates some embodiments of a graph 300A comparing a high-temperature cure by a convection heating method 302A and variable frequency microwave source (VFM) curing under elevated pressure 304A. The PoP structure for the graph 300A comprises first and second silicon wafers, each with a thickness of approximately 15 mm, bonded by an electrically-insulating adhesive comprising bismaleimide-triazine (BT) with a thickness of approximately 60 mils (i.e., approximately 1.5 mm).

The convection heating method 302A comprises exposing a PoP structure to a temperature ramp (i.e., a linear increase in temperature) for a first predetermined time period until a desired temperature is achieved, followed by a second predetermined time period where the temperature remains fixed at the desired temperature. For the embodiments of 300A, the convection heating method 302A comprises a 35 minute ramp from room temperature (e.g., approximately 25° C.) to 150° C., followed by a 120 minute exposure at 150° C. The VFM source curing under elevated pressure 304A comprises exposing a PoP structure to four temperature domains over four time periods: first at 85° C. for 35 minutes, second at 105° C. for 5 minutes, third at 125° C. for 5 minutes, and fourth at 145° C. for 25 minutes. The elevated pressure comprises a range of approximately 1 atmosphere and approximately 10 atmospheres of nitrogen.

The convection heating method 302A and VFM source curing under elevated pressure 304A were each repeated for 10 identical PoP structures for the graph 300A, and their results were compared. FIG. 3B illustrates a table 300B comprising some embodiments of results corresponding to an experiment carried out according to FIG. 3A. The PoP structures were also subjected to three sequential high-temperature steps comprising lead-free solder reflow conditions (3× reflow), wherein the temperature of the PoP structure is increased above the melting point of a respective solder ball. The higher melting point of lead-free solder balls (e.g., Sn/Ag) drives reflow temperature requirements above 240° C. Reflow conditions comprise a steady temperature ramp between approximately 2 and 3 minutes from room temperature to approximately 250° C. The resulting warpage of respective PoP structures was determined by measuring the co-planarity of their edges using a Shadow Moire' technique. De-void monitoring was performed using a CSAM.

The table 300B compares results of the Shadow Moire' measurement for a convection heating method 302B and VFM source curing 304B, and presents a percentage delta 306B for the 10 identical PoP structures of FIG. 3A. Curvature measurements were made for each PoP structure for the BT layer after cure 308B, for the BT layer after 3× reflow 310B, for the silicon layer after cure 312B, and for the silicon wafer after 3× reflow 314B, with their results averaged. For the PoP structures the convection heating method 302B results in a warpage (308B) of the BT layer of approximately 69.5 µm, and VFM source curing 304B results in a warpage of the BT layer of approximately 36 µm, demonstrating a percentage delta 306B of −48% (e.g., relative reduction of 48%). After 3× reflow, warpage (310B) of the BT layer increases to 87.1 µm for the convection heating method 302B, and warpage of the BT layer increases to 76.5 µm for VFM source curing 304B, a relative reduction of −13%. Similarly, for the silicon wafer the convection heating method 302B results in a warpage (312B) of the silicon wafer of approximately 35.2 µm, and VFM source curing 304B results in a warpage of the BT layer of approximately 16.6 µm, demonstrating a percentage delta 306B of −53%. After 3× reflow, warpage (314B) of the silicon wafer increases to 46.7 µm for the convection heating method 302B, and warpage of the silicon wafer increases to 37.5 µm for VFM source curing 304B, a percentage delta 306B of −20%.

The embodiments of 300B demonstrate an overall improvement in warpage for PoP structures subjected to VFM source curing under elevated pressure 304A over PoP structures subjected the convection heating method 302A. Moreover, de-void monitoring demonstrates an elimination of voids when exposing the PoP structures to elevated pressures between approximately 1 atmosphere and approximately 10 atmospheres for a period of approximately 60 minutes. Thus, for the embodiments of table 300B, VFM source curing under elevated pressure 304A demonstrates an overall improvement in PoP structure warpage over the convection heating method 302A, along with the elimination of voids. Although FIG. 3B is not meant to be representative of all curing processes for PoP structures in any way, it does tend to show that the proposed implementation for VFM source curing under elevated pressure can provide significant improvement in PoP warpage compared to some prior art approaches.

Figure 4:
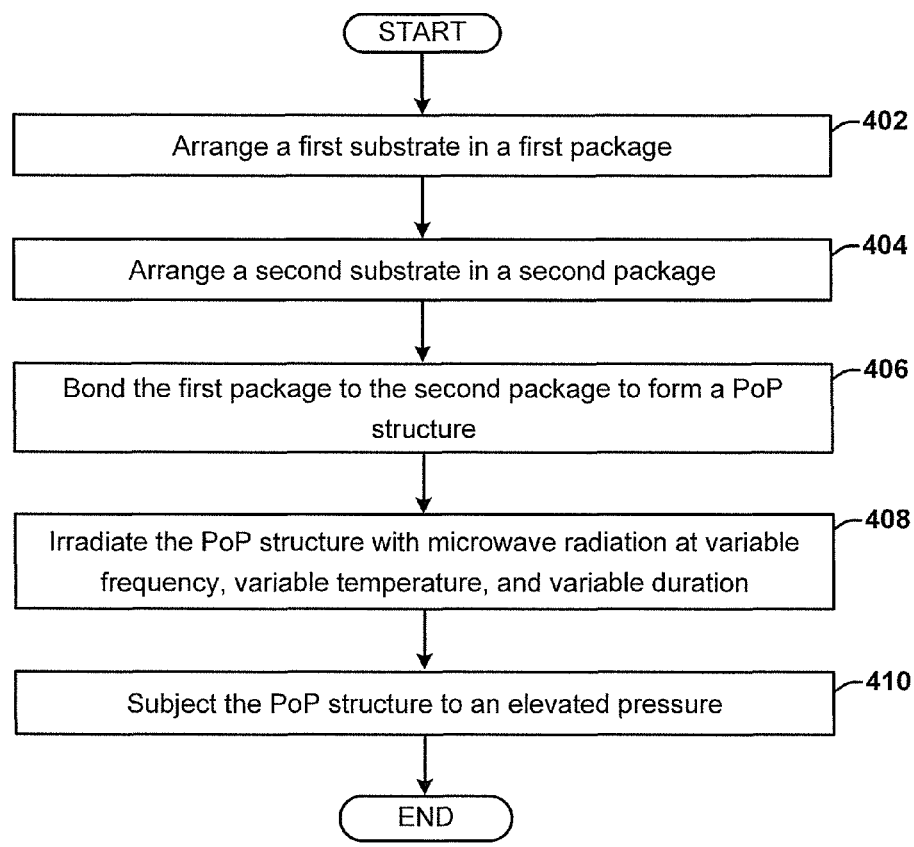
FIG. 4 illustrates a flow diagram of some embodiments of a method of warpage control during package-on-package thermal processing.

FIG. 4 illustrates a flow diagram of some embodiments of a method 400 of warpage control during package-on-package thermal processing. The method 400 also limits void formation within the package-on-package. While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402 a first substrate is arranged in a first package comprising a plurality of first solder balls, the plurality of first solder balls comprising a first flip-chip ball grid array (FCBGA) in some embodiments.

At 404 a second substrate is arranged in a second package comprising a plurality of second solder balls, the plurality of second solder balls comprising a second flip-chip ball grid array (FCBGA) in some embodiments.

At 406 the first package is bonded to the second package with an electrically-insulating adhesive to form a package-on-package (PoP) structure. The electrically-insulating adhesive comprises one or more of polyimide, polyetherimide, benzocyclobutene (BCB), bismaleimide-triazine (BT), epoxy, or silicone in some embodiments.

At 408 the package-on-package structure is irradiated with microwave radiation at variable frequency, variable temperature, and variable duration. In some embodiments, the variable frequency comprises a frequency range comprising approximately five thousand frequencies cycled in a frequency range between approximately 5.8 and 7.0 GHz every 0.1 seconds for a residence time of 25 μs at each frequency. In some embodiments, the variable temperature comprises a temperature range between approximately 85° C. and approximately 145° C., and may further comprise multiple temperature domains over multiple time periods comprising the variable duration to limit the package-on-package structure warpage. For instance, in some embodiments, the multiple temperature domains over multiple time periods comprise exposing the package-on-package structure to four temperature domains over four time periods: first at approximately 85° C. for approximately 35 minutes, second at approximately 105° C. for approximately 5 minutes, third at approximately 125° C. for approximately 5 minutes, and fourth at approximately 145° C. for approximately 25 minutes. The four time periods may comprise a total time of 70 minutes.

At 410 the package-on-package structure is subjected to an elevated pressure. In some embodiments, the elevated pressure comprises a nitrogen gas at a pressure range between approximately 1 atmosphere and approximately 10 atmospheres, for a period of approximately 60 minutes to essentially fully remove voids formed within the electrically-insulating adhesive, and may be performed simultaneously with irradiating the package-on-package structure with the microwave radiation.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a tool arrangement and method to reduce warpage within a package-on-package semiconductor structure, while limiting void formation within an electrically-insulating adhesive which couples the packages. A pressure generator and a variable frequency microwave source are coupled to a process chamber which encapsulates a package-on-package semiconductor structure. The package-on-package semiconductor structure is simultaneously heated by the variable frequency microwave source at variable frequency, variable temperature, and variable duration and exposed to an elevated pressure by the pressure generator. This combination for microwave heating and elevated pressure limits the amount of warpage introduced while preventing void formation within an electrically-insulating adhesive which couples the substrates of the package-on-package semiconductor structure.

In some embodiments, the present disclosure relates to a tool arrangement for package-on-package thermal processing to limit warpage and void formation, comprising a process chamber to surround a package-on-package structure and to isolate the package-on-package structure from an ambient environment surrounding the tool arrangement. The tool arrangement comprises a variable frequency microwave (VFM) source configured to irradiate the package-on-package structure with microwave radiation at variable frequency, variable temperature, and variable duration. The tool arrangement further comprises a pressure generator configured to generate an inert gas at a pressure greater than approximately 1 atmosphere, and deliver the inert gas to the process chamber simultaneous to VFM source irradiation. A controller is configured to independently control operation of the pressure generator and the VFM source.

In some embodiments, the present disclosure relates to a method of warpage control during package-on-package thermal processing, comprising arranging a first substrate in a first package comprising a plurality of first solder balls and arranging a second substrate in a second package comprising a plurality of second solder balls. Bonding of the first package to the second package with an electrically-insulating adhesive forms a package-on-package structure, and creates voids within the electrically-insulating adhesive. Irradiating the package-on-package structure with microwave radiation at variable frequency, variable temperature, and variable duration limits package-on-package warpage, while subjecting the package-on-package structure to an elevated pressure comprises the removal of voids from within the electrically-insulating adhesive. This method of warpage control during package-on-package thermal processing can provide significant improvement in warpage control compared to some prior art approaches, while essentially eliminating voids from within the electrically-insulating adhesive.

In some embodiments, the present disclosure relates to a package-on-package (PoP) semiconductor structure comprising the steps of arranging a first substrate in a first package comprising a plurality of first solder balls comprising a first flip-chip ball grid array (FCBGA), arranging a second substrate in a second package comprising a plurality of second solder balls comprising a second flip-chip ball grid array (FCBGA), and bonding the first package to the second package with an electrically-insulating adhesive, wherein the bonding creates voids within the electrically-insulating adhesive. The PoP semiconductor structure is then irradiated with microwave radiation at variable frequency, variable temperature, and variable duration to limit warpage, and subjected to an elevated pressure, wherein the elevated pressure comprises the removal of voids from within the electrically-insulating adhesive.

What is claimed is:

1. A tool arrangement for package-on-package thermal processing to limit warpage and void formation, comprising:
- a process chamber configured to surround a package-on-package structure and to isolate the package-on-package structure from an ambient environment surrounding the tool arrangement;
- a variable frequency microwave source configured to heat the package-on-package structure with microwave radiation at variable frequency, variable temperature, and variable duration;
- a pressure generator configured to generate an inert gas and deliver the inert gas to the process chamber simultaneous to irradiating the package-on-package structure with microwave radiation;
- a planarity measurement tool configured to determine warpage of a surface of the package-on-package structure;
- a void monitoring tool configured to monitor void formation within the package-on-package structure; and
- a controller configured to independently control operation of the pressure generator and the variable frequency microwave source based upon the determined warpage and monitored void formation, wherein the pressure generator and the variable frequency microwave source are configured to operate simultaneously to reduce warpage within the package-on-package structure, while minimizing void formation within an electrically-insulating adhesive which couples packages of the package-on-package structure.

2. The tool arrangement of claim 1, wherein the pressure generator is configured to generate the inert gas at a pressure greater than approximately 1 atmosphere to reduce voids in an electrically-insulating adhesive within the package-on-package structure.

3. The tool arrangement of claim 1, wherein the variable frequency microwave source is configured to provide a temperature range greater than approximately 85° C. to limit package-on-package structure warpage.

4. The tool arrangement of claim 3, wherein the variable frequency microwave source is configured to operate in multiple temperature domains over multiple time periods.

5. The tool arrangement of claim 1, wherein the planarity measurement tool is configured to monitor warpage of the package-on-package structure by use of a Shadow Moire' technique.

6. The tool arrangement of claim 1 wherein the void monitoring tool comprises a Scanning Acoustical Microscope.

7. The tool arrangement of claim 1, wherein the variable frequency microwave source is configured to subject the package-on-package structure to multiple high-temperature steps comprising lead-free solder reflow conditions, wherein the temperature of the package-on-package structure is increased above a melting point of a respective solder ball which couples respective packages of the package-on-package structure.

8. The tool arrangement of claim 1, wherein the package-on-package structure comprises:
- a first substrate arranged in a first package; and
- a second substrate arranged in a second package;
- wherein the first package is bonded to the second package with an electrically-insulating adhesive to form a package-on-package structure, wherein the bonding creates voids within the electrically-insulating adhesive.

9. The tool arrangement of claim 8, wherein the first and second packages comprise first and second flip-chip ball grid arrays, respectively.

10. The tool arrangement of claim 8, wherein the electrically-insulating adhesive comprises one or more of polyimide, polyetherimide, benzocyclobutene, bismaleimide-triazine, epoxy, or silicone.

11. The tool arrangement of claim 1, wherein the variable frequency microwave source is configured to irradiate the package-on-package structure with microwave radiation with a frequency range between approximately 5.8 GHz and 7.0 GHz cycled every 0.1 seconds for a residence time of 25 μs at each frequency.

12. The tool arrangement of claim 3, wherein the variable frequency microwave source is further configured to provide a temperature range of less than approximately 145° C.

13. The tool arrangement of claim 4, wherein the variable frequency microwave source is further configured to expose the package-on-package structure to four temperature domains over four time periods: first at approximately 85° C. for approximately 35 minutes, second at approximately 105° C. for approximately 5 minutes, third at approximately 125° C. for approximately 5 minutes, and fourth at approximately 145° C. for approximately 25 minutes to reduce package-on-package warpage.

* * * * *